(12) United States Patent
Segovia Fernandez et al.

(10) Patent No.: US 11,621,694 B2
(45) Date of Patent: Apr. 4, 2023

(54) LAMB WAVE RESONATOR-BASED TORQUE SENSOR

(71) Applicant: TEXAS INSTRUMENTS INCORPORATED, Dallas, TX (US)

(72) Inventors: Jeronimo Segovia Fernandez, San Jose, CA (US); Peter Smeys, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 936 days.

(21) Appl. No.: 16/509,224

(22) Filed: Jul. 11, 2019

(65) Prior Publication Data

US 2020/0186120 A1 Jun. 11, 2020

Related U.S. Application Data

(60) Provisional application No. 62/776,050, filed on Dec. 6, 2018.

(51) Int. Cl.
| | |
|---|---|
| *H03H 9/145* | (2006.01) |
| *H03H 9/02* | (2006.01) |
| *H03H 9/25* | (2006.01) |
| *H01L 41/053* | (2006.01) |
| *G01L 3/10* | (2006.01) |

(52) U.S. Cl.
CPC ........... *H03H 9/02952* (2013.01); *G01L 3/10* (2013.01); *H01L 41/0533* (2013.01); *H03H 9/02637* (2013.01); *H03H 9/145* (2013.01); *H03H 9/25* (2013.01)

(58) Field of Classification Search
CPC .. H01L 41/0533; H03H 9/02952; H03H 9/25; H03H 9/145; H03H 9/02637; G01L 3/10
See application file for complete search history.

(56) References Cited

U.S. PATENT DOCUMENTS

| | | | | |
|---|---|---|---|---|
| 5,585,571 | A * | 12/1996 | Lonsdale | G01L 1/165 73/862.321 |
| 8,015,886 | B2 * | 9/2011 | Lohr | G01L 3/1428 73/862.326 |
| 9,673,777 | B2 * | 6/2017 | Andle | G01K 11/265 |
| 2005/0001511 | A1 * | 1/2005 | Kalinin | G01L 3/106 310/313 A |
| 2015/0369678 | A1 * | 12/2015 | Yoshida | G01L 1/165 29/25.35 |
| 2016/0182009 | A1 * | 6/2016 | Bhattacharjee | H01L 41/33 310/313 R |
| 2017/0299449 | A1 * | 10/2017 | Nakamura | G01N 29/07 |
| 2020/0259480 | A1 * | 8/2020 | Pensala | H03H 9/02228 |
| 2021/0167752 | A1 * | 6/2021 | Caron | H03H 9/58 |

FOREIGN PATENT DOCUMENTS

WO WO-2008155346 A1 * 12/2008 ......... H03H 9/02535

* cited by examiner

*Primary Examiner* — J. San Martin (74) *Attorney, Agent, or Firm* — Valerie M. Davis; Frank D. Cimino (57) ABSTRACT

A torque sensor chip including a semiconductor substrate, an acoustic reflector formed on the semiconductor substrate, and first and second Lamb wave resonators (LWRs). The first LWR is formed on a side of the acoustic reflector opposite the semiconductor substrate. The first LWR is at a first angle with respect to an axis of the IC. The second LWR also is formed on the side of the acoustic reflector opposite the semiconductor substrate. The second LWR is at a second angle, different than the first angle, with respect to the axis of the IC.

23 Claims, 12 Drawing Sheets

LAMB WAVE RESONATOR-BASED TORQUE SENSOR

CROSS-REFERENCE TO RELATED APPLICATIONS

This application claims priority to U.S. Provisional Application No. 62/776,050, filed Dec. 6, 2018, which is hereby incorporated by reference.

BACKGROUND

The torque sensor is a transducer that converts a torsional mechanical input into an electrical output signal. Optical, magnetic, and strain gauge transducers can be used to detect torque in rotation shafts. However, such torque sensors are operated using relatively complex instrumentation systems, particularly in the case of optical and magnetic sensors. Strain gauges are mounted on hollow shafts to achieve high resolution. By comparison, surface acoustical wave (SAW) torque sensors can be wirelessly operated using radio frequency (RE) couplers, and mounted on solid shafts while achieving high resolution. However, SAW torque sensors are limited to Very High Frequency (VHF) operation, cannot be fabricating using standard semiconductor techniques, and generally require large footprints to overcome the interconnect parasitics.

SUMMARY

In one example, a torque sensor chip includes a semiconductor substrate, an acoustic reflector formed on the semiconductor substrate, and first and second Lamb wave resonators (LWRs). The first LWR is at a first angle with respect to an axis of the chip. The second LWR is at a second angle, different than the first angle, with respect to the axis of the chip. The first and second LWRs are acoustically isolated from the semiconductor substrate.

BRIEF DESCRIPTION OF THE DRAWINGS

For a detailed description of various examples, reference will now be made to the accompanying drawings in which.

DETAILED DESCRIPTION

The disclosed torque sensor comprises a torque sensor device that includes Lamb Wave Resonators (LWRs). The LWR-based torque sensor described herein is particularly useful for determining torque applied to a shaft. In one example, a pair of LWRs is attached to the outer surface of a shaft at angles of +45° in −45°, respectively, with respect to the longitudinal axis of the shaft. The 45°-shifted LWR's are used to detect the diagonal strain $(S_{45°})$ exhibited on the outer surface of the shaft, which is a function of applied torque by using the following equation when the shaft is solid:

$$s_{45°} = \frac{8M}{\pi GD^3} \quad (1)$$

and the following equation when the shaft is hollow:

$$s_{45°} = -\frac{8DM}{\pi G(D^4 - d^4)} \quad (2)$$

where M is torque, G is the elastic modulus of the material comprising the shaft, and D and d (capital D and lowercase d) are the outer and inner diameters of the shaft, respectively. A third LWR may be also mounted to the outer surface of the shaft but in line with the longitudinal axis of the shaft. The third LWR may be used to compensate for any other intrinsic frequency variations which are attributed to environmental factors such as temperature and/or humidity. The torque sensor device can be attached to the surface of the shaft by using either adhesive epoxy, eutectic bonding or soldering techniques. In one example, the bonding material has a relatively large elastic modulus to couple most of the strain exhibited on the shaft surface into the torque sensor device. As an example, a bonding material whose elastic modulus is greater than 3 GPa can couple more than 85% of the strain exhibited on the surface of the shaft into the torque sensor chip when this is made of silicon. Moreover, the in-plane dimensions in relation to the thickness of the torque sensor chip help to improve the amount of strain that can be coupled between the bottom surface of the chip attached to the shaft and the top surface of the chip that contains the LWRs. As an example, a torque sensor device (e.g., a chip) whose thickness is 200 μm should have a footprint area of at least 25 mm² to couple more than 85% of the strain exhibited on the surface of the shaft into the LWRs when they are fabricated on a silicon substrate.

An LWR comprises a piezoelectric film sandwiched between metal layers and acoustically isolated from a semiconductor substrate. The top metal layer is patterned, and forms an interdigitated (IDT) electrode. The top metal layer may also form two side acoustic wave reflectors as a way to concentrate the acoustic vibration under the IDT electrode and enhance the resonator quality factor (Q). The bottom metal layer functions as a floating plate in an RF one-port configuration. The electrode pitch (p) sets, in part, the resonance frequency of the LWR per the following equation:

$$f_r = \frac{v_p}{2p} \quad (3)$$

where $v_p$ represents the acoustic phase velocity of the acoustic wave in the lateral direction within the piezoelectric and electrode materials and $f_r$ is the resonant frequency. As it can be seen from Eq. (2) above, the resonance frequency of the LWR is a function of the p of the IDT electrode and the $v_p$ of the composite resonant structure. As torque is applied to the shaft, the electrode pitch of the LWRs changes. When the thickness of the piezoelectric layer is comparable to the width of each IDT electrode, the changes in electrode pitch and thickness of the piezoelectric layer affect the acoustic phase velocity. As a result, p and $v_p$ may change with torque and vary the resonance frequency. In an ideal case in which the shaft is only subjected to torque and there are two LWRs (first and second LWRs) oriented exactly at positive and negative 45 degrees with respect to the longitudinal axis, the pitch and thickness of the first LWR will change in opposite direction to the pitch and thickness of the second LWR. As a result, the resonance frequency of the first LWR will change in opposite direction to the resonance frequency of the second LWR. The difference in resonance frequency of the first LWR minus the second LWR is a function of the applied torque and, depending on the direction of torque, will become positive or negative. Therefore, the magnitude and direction of torque can be determined based on the absolute value and sign of the difference in resonance frequency of the first LWR minus the second LWR. To measure torque, a sensor monitoring system determines the resonance frequency of the LWRs.

Figure 1:
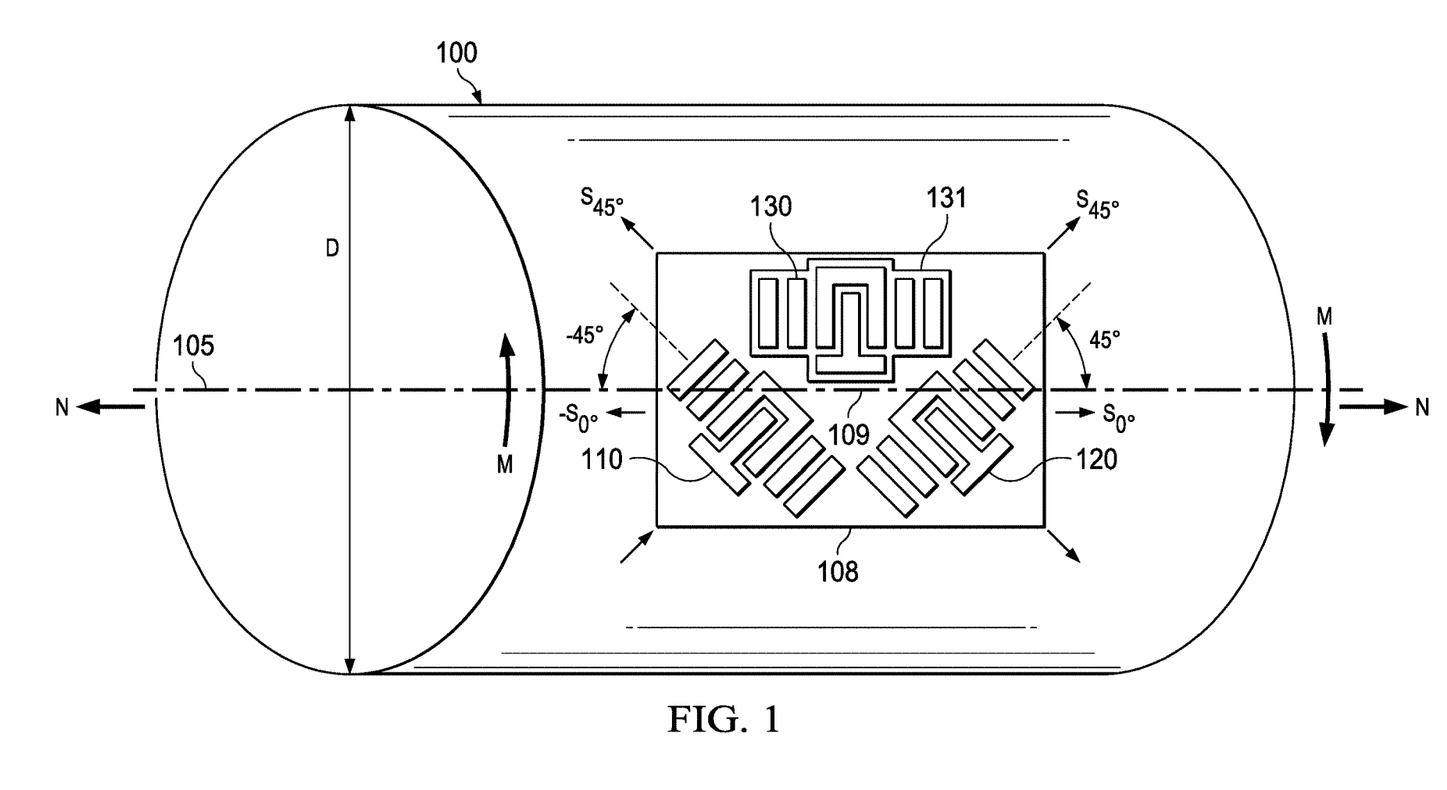
FIG. 1 illustrates an example of a torque sensor device, based on three LWRs mounted, onto the outer surface of a shaft that is subjected to torque.

FIG. 1 shows a shaft 100. The shaft 100 may be subjected to torque (M) and/or compression/expansion forces (N). In one implementation, the torque sensor 108 comprises a chip containing three LWRs 110, 120, and 130. The torque sensor 108 is attached to the outer surface of shaft 100 in the example of FIG. 1. The LWRs 110, 120, and 130 are fabricated on a common semiconductor substrate in this example. As shown, LWRs 110 and 120 are provided at an angle with respect to each other and with respect to LWR torque sensor 130 such that when the torque sensor device 108 is attached to the outer surface of the shaft 100, LWR 120 will be aligned at an angle that is +45° with respect to the longitudinal axis 105 of the shaft 100. The LWR 110 will be oriented at an angle that is −45° with respect to the longitudinal axis 105. The LWRs are oriented at +45° and −45° with respect to an axis 105 of the torque sensor device 108. A trench 131 is formed around LWR 130 while leaving access points for electrical connections to the electrodes of the LWR 130. The LWR 130 is oriented to be in parallel with the longitudinal axis 105 (and axis 109 of the LWR 108).

Under torque, LWR 110 and LWR 120 will be subjected to diagonal strain components of opposite sign. Based on the specific torque direction shown on FIG. 1, LWR 110 will be subjected to a diagonal strain component having a positive sign)(+$s_{45}°$) and LWR 120 will be subjected to a diagonal strain component having a negative sign)(−$s_{45}°$). Under compression/expansion forces N, LWR 110 and LWR 120 will be subjected to the same axial strain component. Based on the specific compression/expansion direction shown on FIG. 1, both LWRs will be subjected to the same strain component having a positive sign)(+$s_0°$.

When the shaft is subjected to torque and compression/expansion forces simultaneously, the resonance frequency of all LWRs contained in the torque sensor 108 will be affected by both diagonal and axial strain components. Further, ambient humidity and/or temperature may change during torque monitoring, which may also affect the resonance frequency of the LWRs. These external sources of resonance frequency shift can be isolated and quantified by using several LWRs placed at different angles with respect to the longitudinal axis. In the case that we have three LWRs placed at +45°, −45° and 0° with respect to the longitudinal axis, such as the example shown in FIG. 1, we can use the following system of equations to determine variations in diagonal strain ($\Delta s_{45}°$), axial strain ($\Delta s_0°$), and environmental factor coefficient (EF):

$$m_1 \Delta s_{45°} + n_1 \Delta s_0° + r\text{EF} = \Delta f_{r1} \quad (4)$$

$$-m_2 \Delta s_{45°} + n_2 \Delta s_0° + r\text{EF} = \Delta f_{r2} \quad (5)$$

$$m_3 \Delta s_{45°} + n_3 \Delta s_0° + r\text{EF} = \Delta f_{r3} \quad (6)$$

where $m_1$, $m_2$ and $m_3$ are the frequency sensitivities to $\Delta s_{45}°$ of LWRs 110, 120 and 130, respectively, $n_1$, $n_2$ and $n_3$ are the frequency sensitivities to $\Delta s_0°$ of LWRs 110, 120 and 130, respectively, r is the frequency sensitivity to EF of each LWR, and $\Delta f_{r1}$, $\Delta f_{r2}$ and $\Delta f_{r3}$ are the total frequency shifts of LWRs 110, 120 and 130, respectively. The values of $m_1$, $m_2$, $m_3$, $n_1$, $n_2$, $n_3$ and r are determined prior to final shaft operation at the calibration stage. The values of $\Delta f_{r1}$, $\Delta f_{r2}$ and $\Delta f_{r3}$ are determined by monitoring the resonance frequency of every LWR independently. The system of equations (4-6) above contains three equations and three unknowns ($\Delta s_{45}°$, $\Delta s_0°$ and EF) that can be solved by using Gaussian elimination. In an example, the solution to equations (4), (5) and (6) is:

$$\Delta s_{0°} = \frac{m_1(\Delta f_{r3} - \Delta f_{r2}) + m_2(\Delta f_{r3} - \Delta f_{r1}) + m_3(\Delta f_{r2} - \Delta f_{r1})}{m_1(n_3 - n_2) + m_2(n_3 - n_1) + m_3(n_2 - n_1)} \quad (7)$$

$$\Delta s_{45°} = \frac{\Delta f_{r1} + \Delta f_{r2} - 2\Delta f_{r3}}{m_1 - m_2 - 2m_3} - \frac{n_1 + n_2 - 2n_3}{m_1 - m_2 - 2m_3} \Delta s_{0°} \quad (8)$$

$$E. = \frac{\Delta f_{r3}}{r} - \frac{m_3}{r} \Delta s_{45°} - \frac{n_3}{r} \Delta s_{0°} \quad (9)$$

Using equation (7), the axial strain can be determined and related to either a bending moment or a longitudinal force N applied to the shaft 100. Using equation (8), the diagonal strain can be determined and related to torque M applied to the shaft. Equation (9) can be used to determine the environmental factor coefficient (EF) and to relate this magnitude to either temperature or humidity variations. The solutions to the system of equations (7), (8) and (9) can be simplified if LWRs 110 and 120 are identical resonators that are placed at +45° and −45° with respect to the longitudinal axis ($m=m_1=m_2$ and $n=n_1=n_2$) and LWR 130 is either surrounded by etched trenches (e.g., trench 131 in FIG. 1) or released from the substrate (show in FIG. 1) fulfilling the following condition:

$$m_3 \Delta s_{45°} + n_3 \Delta s_{0°} \ll r\text{EF} \quad (10)$$

Under previous conditions, the diagonal strain component becomes independent of the axial strain component and the environmental factor coefficient becomes independent of both diagonal and axial strain components as it is shown in the following equations:

$$\Delta s_{0°} = \frac{\Delta f_{r1} + \Delta f_{r2}}{2n} - \frac{r\text{EF}}{n} \quad (11)$$

$$\Delta s_{45°} = \frac{\Delta f_{r1} - \Delta f_{r2}}{2m} \quad (12)$$

$$\text{EF} = \frac{\Delta f_{r3}}{r} \quad (13)$$

In an example, equation (13) is used to determine the environmental temperature (assuming that humidity does not affect the resonance frequency of any LWR in the sensor) and feed a predefined algorithm that relates any variations on m and n to environmental temperature. Consequently, any variations in the resonance frequencies of the first and second LWRs as a result of a change in environmental temperature can be corrected by using the aforementioned algorithm.

Figure 2:
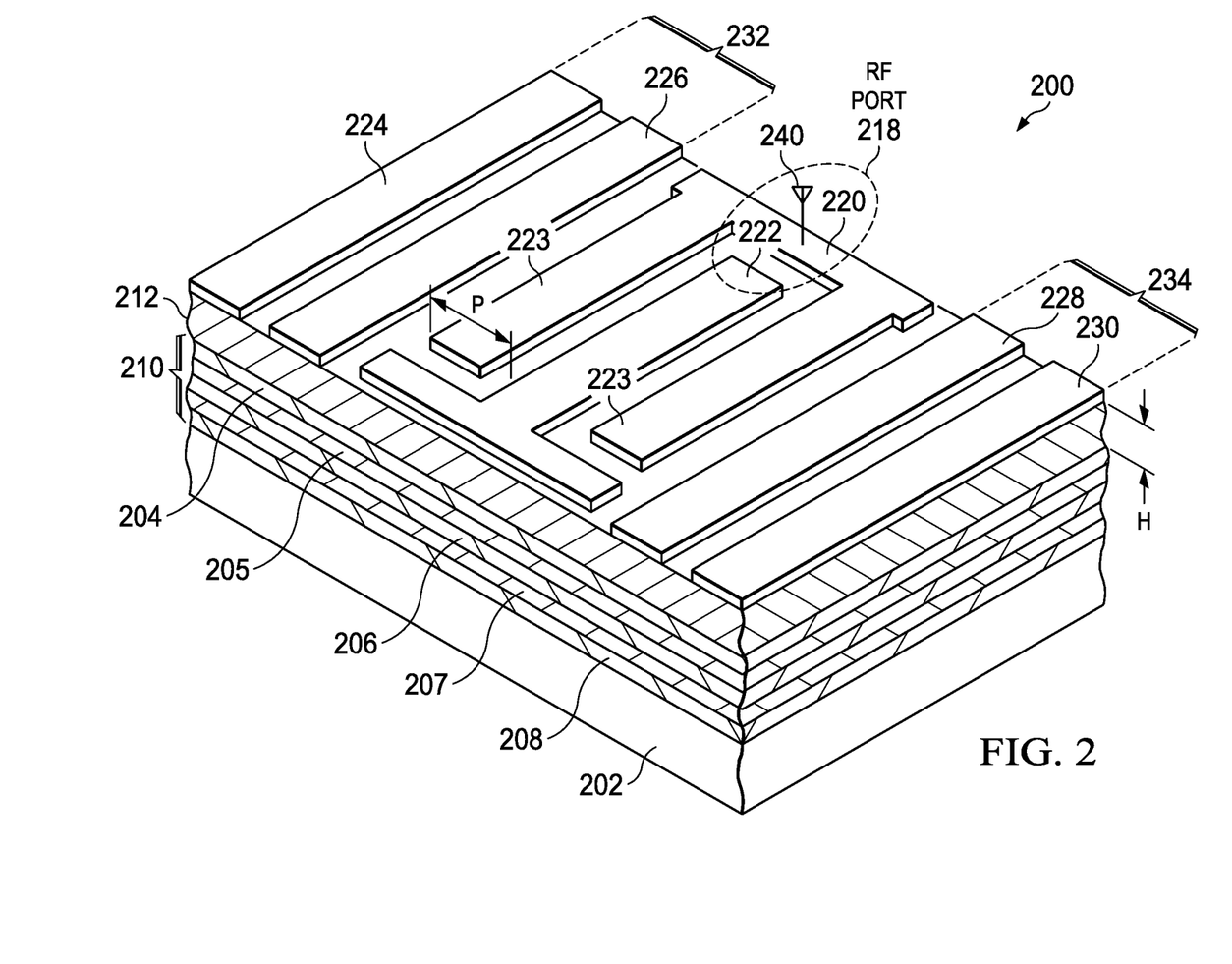
FIG. 2 shows a three-dimensional (3D) view of an example of an LWR usable in the torque sensor device of FIG. 1.

FIG. 2 shows a single LWR torque sensor 200. The structure of the LWR torque sensor 200 can be used for any or all of the LWR torque sensors 110, 120, and 130 in FIG. 1. The example LWR torque sensor 200 of FIG. 2 comprises multiple layers including a semiconductor substrate 202, a Bragg reflector 210, a piezoelectric layer 212 an interdigitated (IDT) electrode 218, and side acoustic reflectors 232 and 234. The Bragg reflector 210 comprises low impedance layers 204, 206, and 208, and high impedance layers 205 and 207. The reference to "impedance" refers to "acoustic impedance." The impedance of low impedance layers 204, 206, and 208 is lower than that of high impedance layers 205 and 207. The combination of the alternating low and high impedance layers 204-208 represents the Bragg reflector 210, which is an acoustic reflector and acoustically isolates the piezoelectric layer 212 from the silicon substrate 202. The use of the side acoustic reflectors 232 and 234 and the Bragg reflector help to confine the acoustic energy to be predominantly within the piezoelectric layer 212 and under the IDT electrode 218. In this particular example, the Bragg reflector 210 comprises five layers 204-208, but can include a number of alternating high and low impedance layers other than five in other examples. In one example, the low impedance layers 204, 206, and 208 comprise silicon dioxide, and high impedance layers 205 and 207 comprise a metal such as titanium/tungsten.

The piezoelectric layer 212 can be fabricated from any suitable piezoelectric material such as Aluminum Nitride (AlN) or doped-AlN. The thickness of the piezoelectric layer is H.

The IDT electrode 218 comprises a positive electrode 220 and a negative electrode 222. In one example, electrode 220 is connected to an antenna (e.g., antenna 240), and electrode 222 is connected to ground. The positive electrode 720 includes two conductive portions 721 and 723 interleaved between corresponding portions 724, 726, and 728 of the negative electrode 722. The IDT electrode pitch is designated as P. The electrode pitch P is configured to be one-half the wavelength of Lamb wave generated within the piezoelectric layer 212 when excited at its resonant frequency. In one implementation, H is less than P. In other implementations, however, H is equal to or greater than P. The positive and negative electrodes 220 and 222 of the IDT electrode 218 comprises a metal, which may be the same or different as the high impedance layers 205 and 207 of the Bragg reflector 210.

Figure 5:
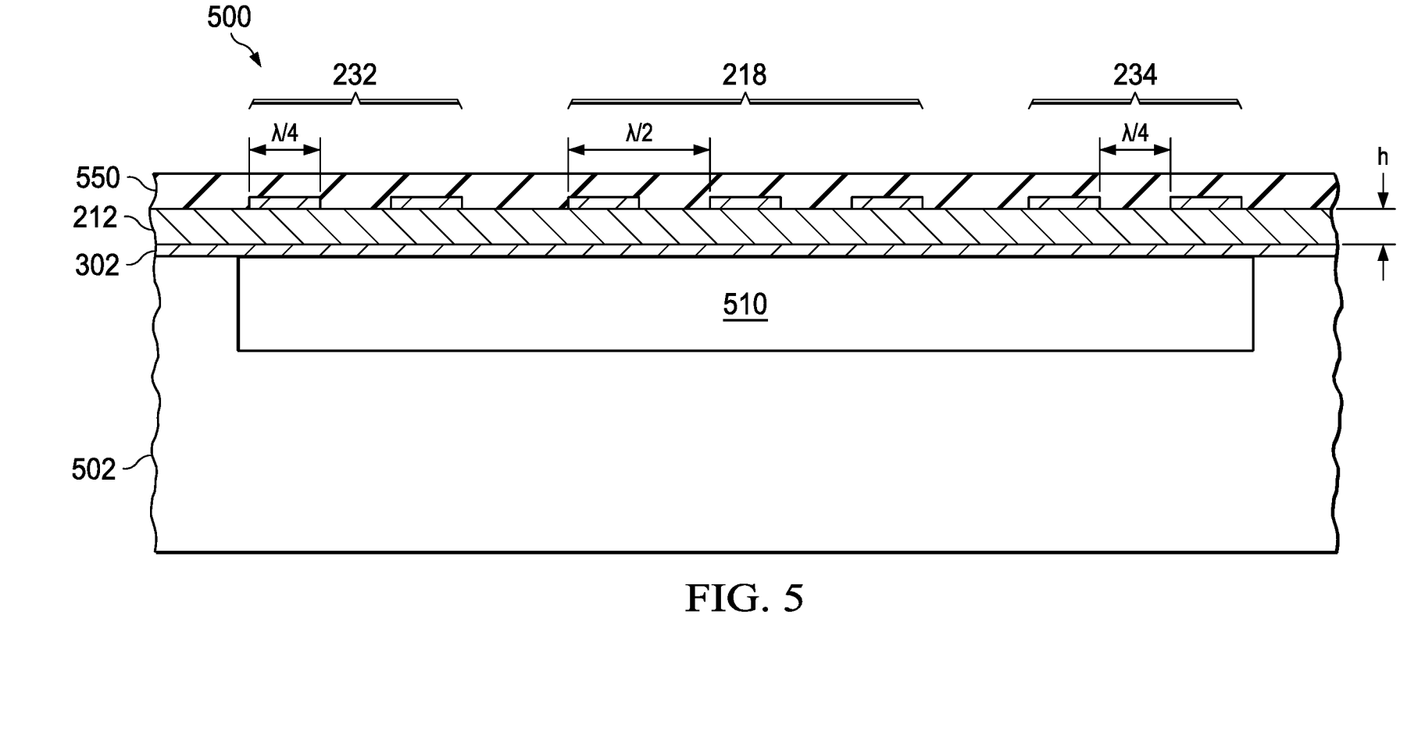
FIG. 5 shows a cross-sectional view of yet another example of an LWR in which the silicon substrate comprises a cavity.

The side reflectors 232 and 234 help to confine the acoustic energy generated by the piezoelectric layer 212 to be near the IDT electrode 218. Each of the side acoustic reflectors 232 and 234 alternate lower and higher impedance elements that correspond to regions of the piezoelectric plate that are covered and uncovered by metal strips, respectively. In the example of FIG. 5, side acoustic reflector 232 comprises two low acoustic impedance elements 224 and 226 that intercalate three high acoustic impedance elements. Similarly, side acoustic reflector 234 comprises low acoustic impedance elements 228 and 230 that intercalate three high acoustic impedance elements. The number of lower and higher impedance elements comprising each side acoustic reflector can be more than two and three, respectively. The lower impedance elements 224, 226, 228, and 230 may use the same or different metal in the covered regions of the piezoelectric plate as the one used to build the IDT electrode layer.

Figure 3:
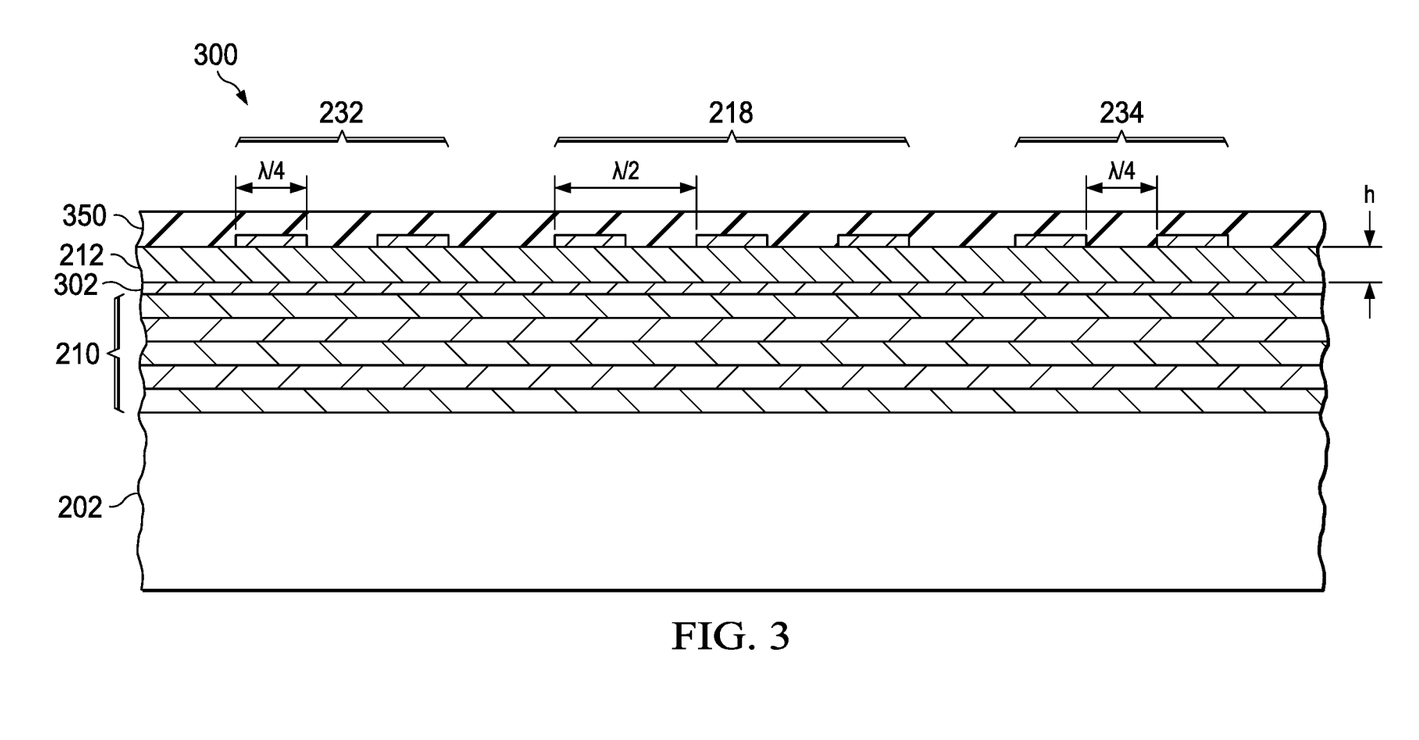
FIG. 3 shows a cross-sectional view of an example of an LWR comprising an acoustic Bragg reflector located on top of the silicon substrate.

FIGS. 3 through 6 illustrate different examples of packaging for a LWR torque sensor IC. The example of FIG. 3 is similar to that of FIG. 2 and comprises the silicon substrate 202, the Bragg reflector 210, the piezoelectric layer 212, IDT electrode 218, and side reflectors 232 and 234. A metal layer 302 is also disposed between the piezoelectric layer 212 and the Bragg reflector 210. The metal layer 302 may be made from the same material as the IDT electrode 218. A passivation layer 350 is provided as well as shown. The passivation layer may comprise silicon nitride, silicon dioxide, or another suitable material.

Figure 4:
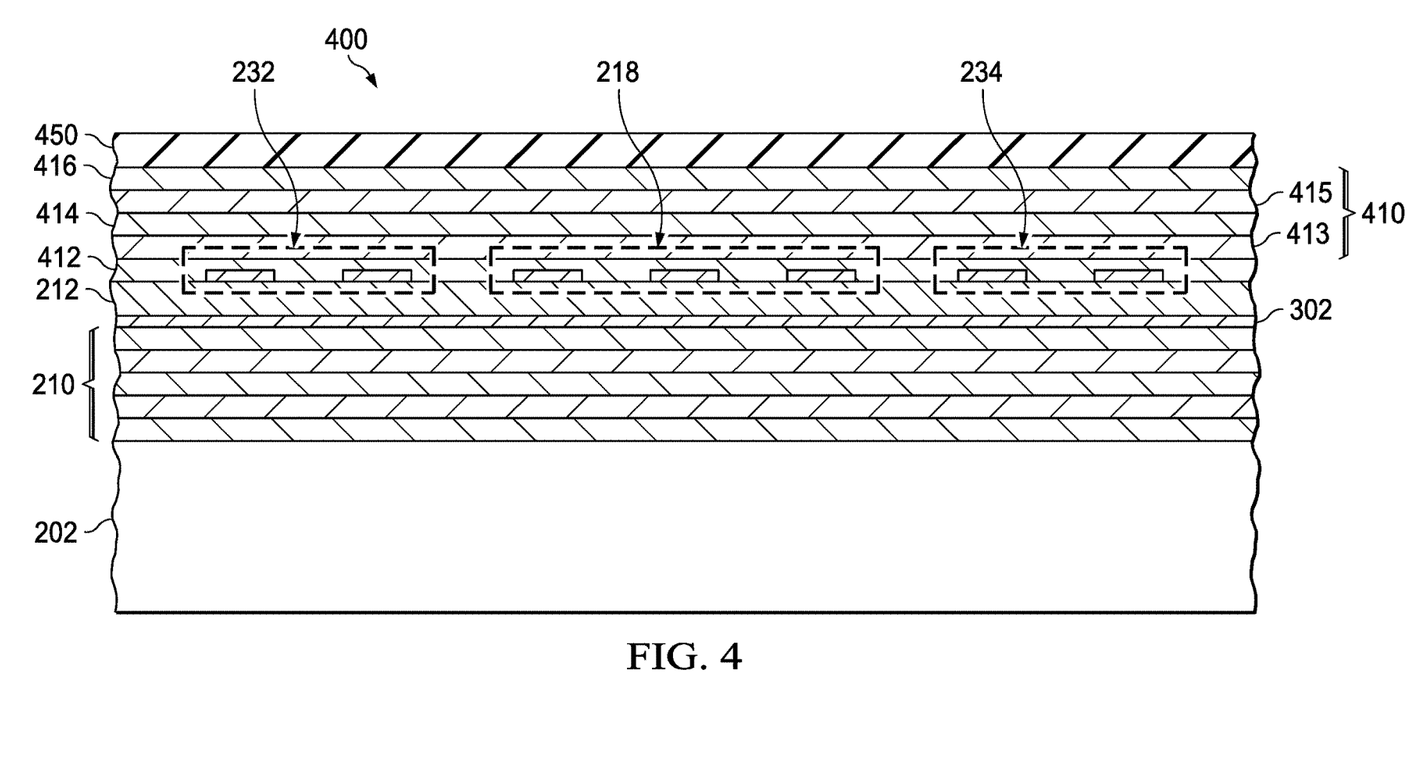
FIG. 4 shows a cross-sectional view of another example of an LWR comprising a second acoustic Bragg reflector located on top of the electrode layer to protect the LWR torque sensor from contaminants.

FIG. 4 shows an example similar to that of FIG. 3, but with a second Bragg reflector 410 disposed on the opposing side of the piezoelectric layer 212 from Bragg reflector 210. Like Bragg reflector 210, Bragg reflector 410 also comprises alternating layers of lower and higher impedance materials. The lower impedance layers of Bragg reflector 410 comprise layers 412, 414, and 416 and the higher impedance layers comprise layers 413 and 415. The materials selected for lower impedance layers 412, 414, and 416 may be the same material as use for the lower impedance layers of the Bragg reflector 210. Similarly, the material selected for the higher impedance layers 413 and 415 may be the same material selected for the higher impedance layers of the Bragg reflector 210. The second Bragg reflector 410 encapsulates the LSR torque sensor IC 108 from contaminants in the environment around the torque sensor IC. A passivation layer 450 is provided as well as shown. The passivation layer may comprise silicon nitride, silicon dioxide, or another suitable material.

FIG. 5 shows another LWR torque sensor IC 500 comprising a silicon substrate 502 in which a cavity 510 has been formed. Metal layer 302 and piezoelectric layer 512 are formed over the silicon substrate 502 thereby covering the cavity 510. In one example, the cavity 510 is an air-filled cavity. In another example, the cavity 510 is at vacuum pressure. The cavity 510 functions to acoustically isolate the silicon substrate 502 from the piezoelectric layer 512. As such, cavity 510 comprises an acoustic reflector. A passivation layer 550 is provided as well as shown. The passivation layer may comprise silicon nitride, silicon dioxide, or another suitable material.

Figure 6:
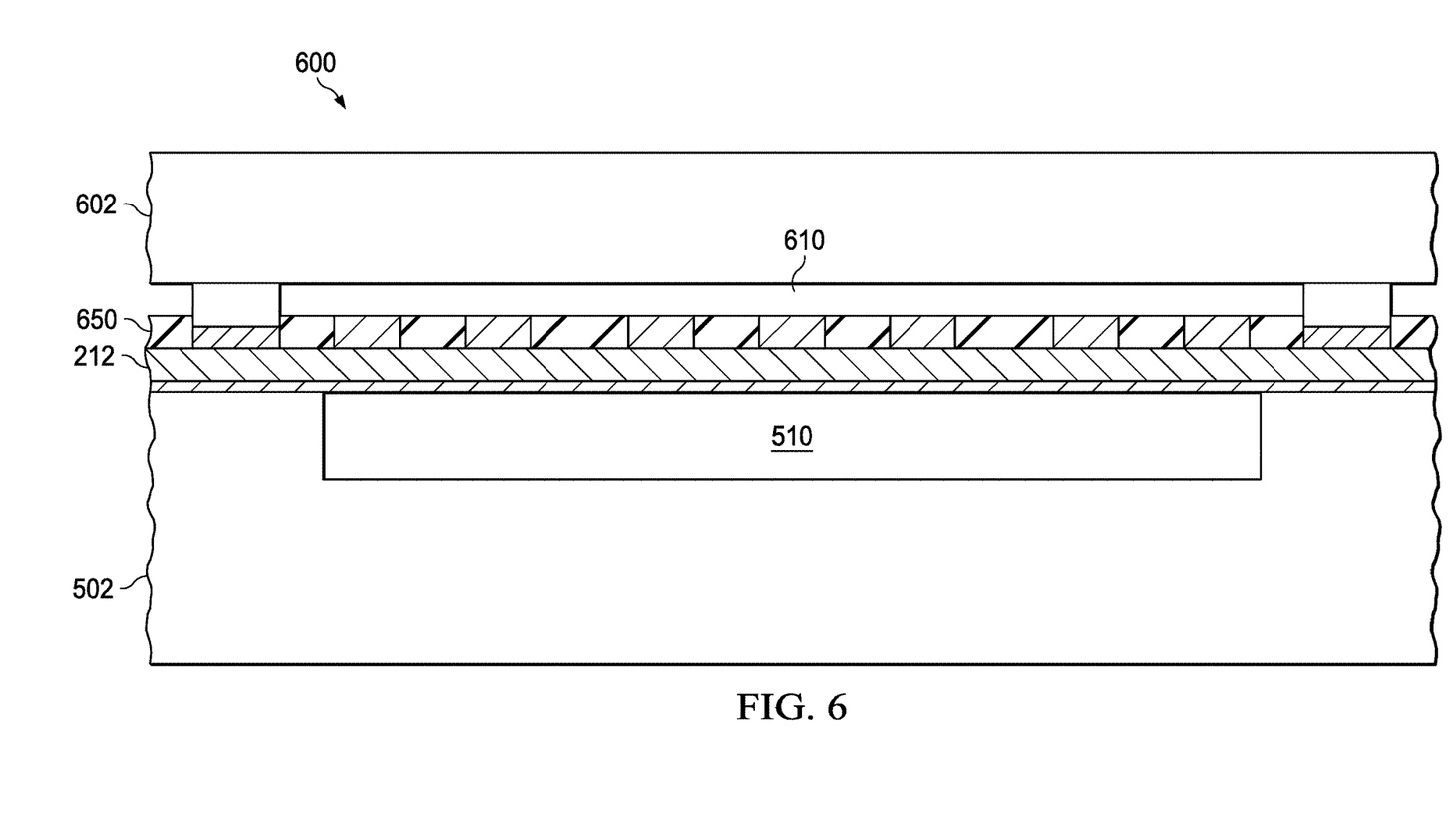
FIG. 6 shows a cross-sectional view of an example of an LWR comprising a second silicon substrate bonded to the first substrate and forming a second cavity to encapsulate the LWR.

FIG. 6 shows an example of a LWR torque sensor IC 600 similar to LWR torque sensor IC 500 of FIG. 5. In addition to silicon substrate 502 having cavity 510, the LWR torque sensor IC 600 of FIG. 6 includes a second silicon substrate 602 having a cavity 610 positioned on the opposing surface of the piezoelectric layer 212. Cavity 610 can be air-filled, or a vacuum. As such, cavities 510 and 610 are on opposite sides of the piezoelectric layer 212. Cavity 510 acoustically isolates silicon substrate 502 from piezoelectric layer 212, and silicon substrate 602 encapsulates the LWR torque sensor IC 600 thereby protecting it from contaminants. A passivation layer 650 is provided as well as shown. The passivation layer may comprise silicon nitride, silicon dioxide, or another suitable material.

Figure 7:
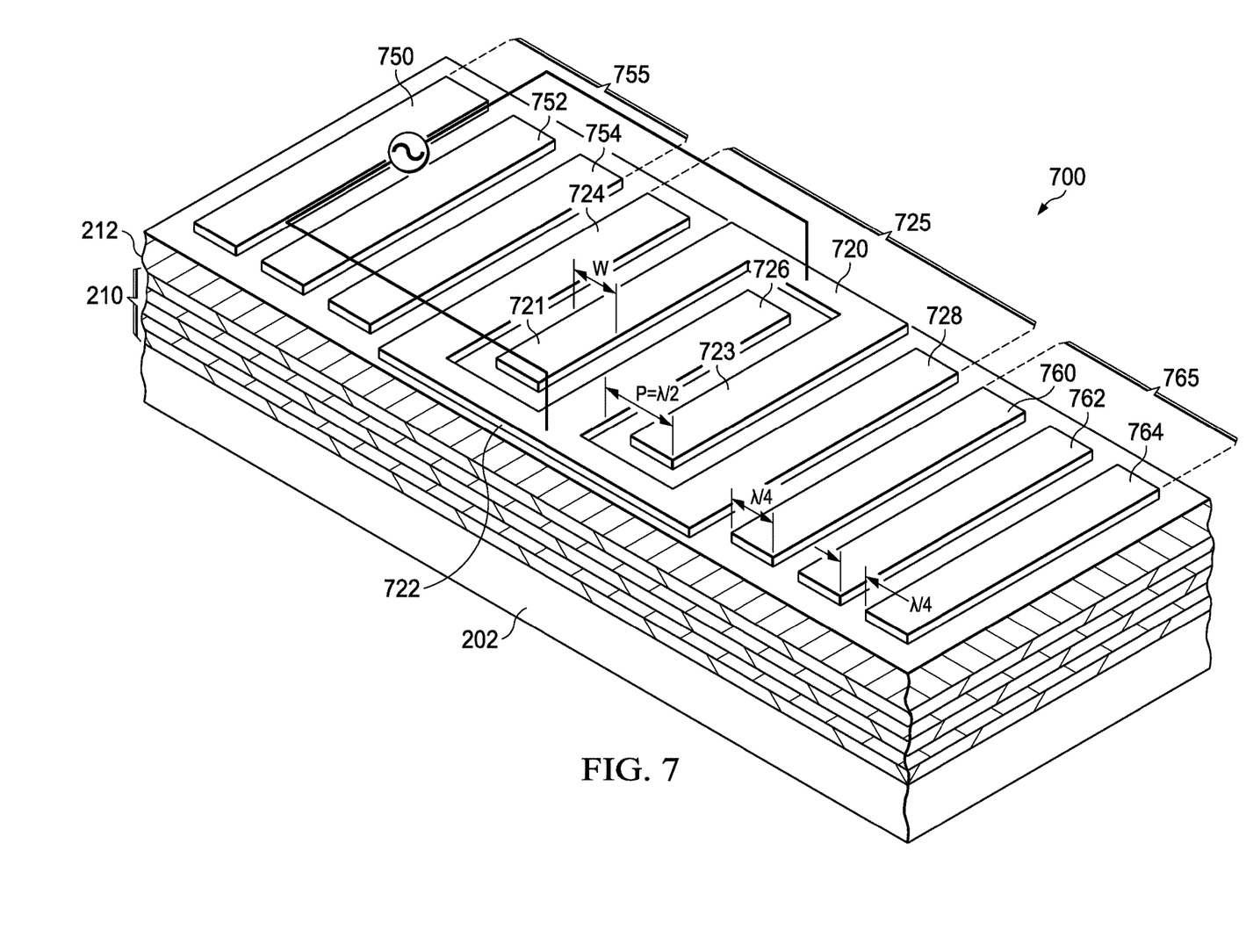
FIG. 7 shows a 3D view of an example of an LWR comprising three low impedance elements for each of the side reflectors.

FIG. 7 shows an example of an LWR torque sensor IC 700 comprising semiconductor substrate 202, Bragg reflector 210, piezoelectric layer 212, an IDT electrode 725, and side acoustic reflectors 755 and 765. IDT electrode 725 comprises a positive electrode 720 and a negative electrode 722. The positive electrode 720 includes two conductive portions 721 and 723 interleaved between corresponding portions 724, 726, and 728 of the negative electrode 722. The side acoustic reflectors in the example of FIG. 7 include three lower impedance elements. Side acoustic reflector 755 includes lower impedance elements 750, 752, and 754, while side acoustic reflector 765 includes lower impedance elements 760, 762, and 764.

Figure 8:
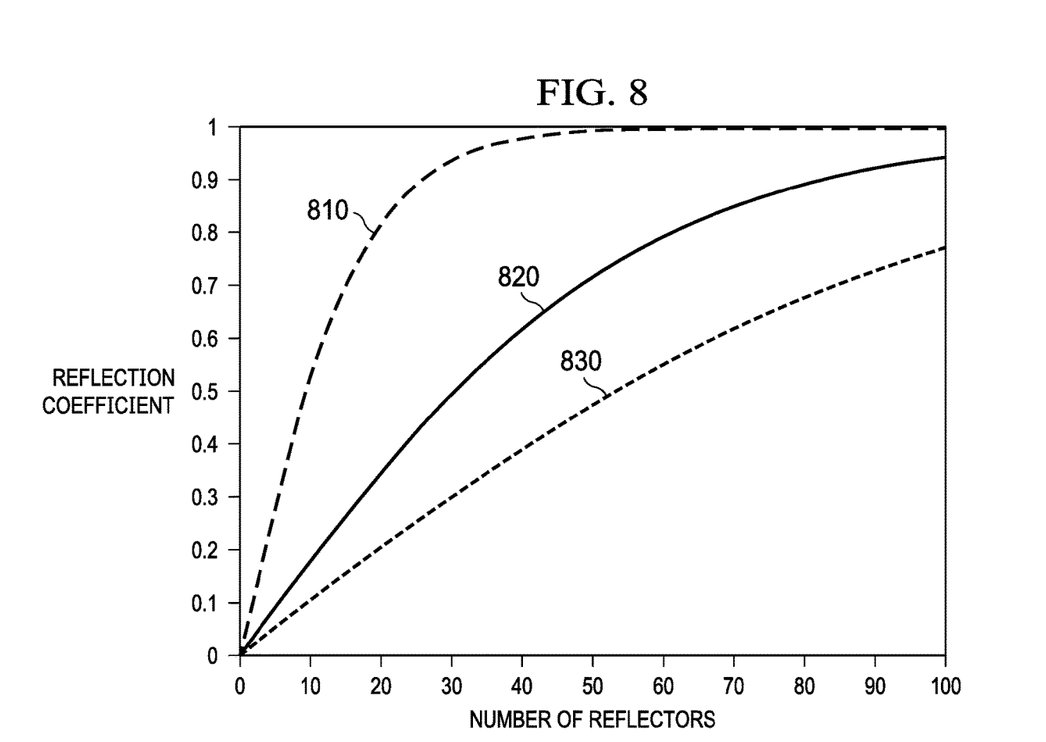
FIG. 8 shows plots of reflection coefficient versus the number of side reflectors comparing LWR and SAW resonators.

The electrode pitch P is configured to be one-half the wavelength of Lamb wave generated within the piezoelectric layer 212 when excited at its resonant frequency. The pitch of the lower impedance elements 750, 752, 754, 760, 762, and 764 within the side acoustic reflectors is one-quarter the wavelength. The width (W) of each electrode conductive portion 721, 723, 724, 726, and 728 is W. In one example W is one-quarter the wavelength. FIG. 8 illustrates one of the benefits of using a lamb wave resonator as the active torque sensor element, rather than a surface acoustic wave device. FIG. 8 shows three plots 810, 820, and 830 of reflection coefficient versus number of reflectors. The number of reflectors refers to the number of lower impedance elements comprising the side acoustic reflectors in the LWR torque sensor. Plot 810 shows the relationship between reflection coefficient and the number of reflectors for an LWR-based torque sensor (such as that described above in FIGS. 1-7). Plots 820 and 830 show the relationship between reflection coefficient and the number of reflectors for surface acoustic wave resonators comprising LiNbO3 (plot 820) and 0.1 micron gold/ST-X Quartz (plot 830). As can be seen for a given number of reflectors, the reflection coefficient for an LWR-based torque sensor is significantly higher than for either of the two surface acoustic wave resonators. Further, a relatively high reflection coefficient (e.g., 95%) can be implemented for the LWR-based torque sensor with many fewer side acoustic reflectors than would be the case to achieve the same reflection coefficient for either of the surface acoustic wave resonators.

Figure 9:
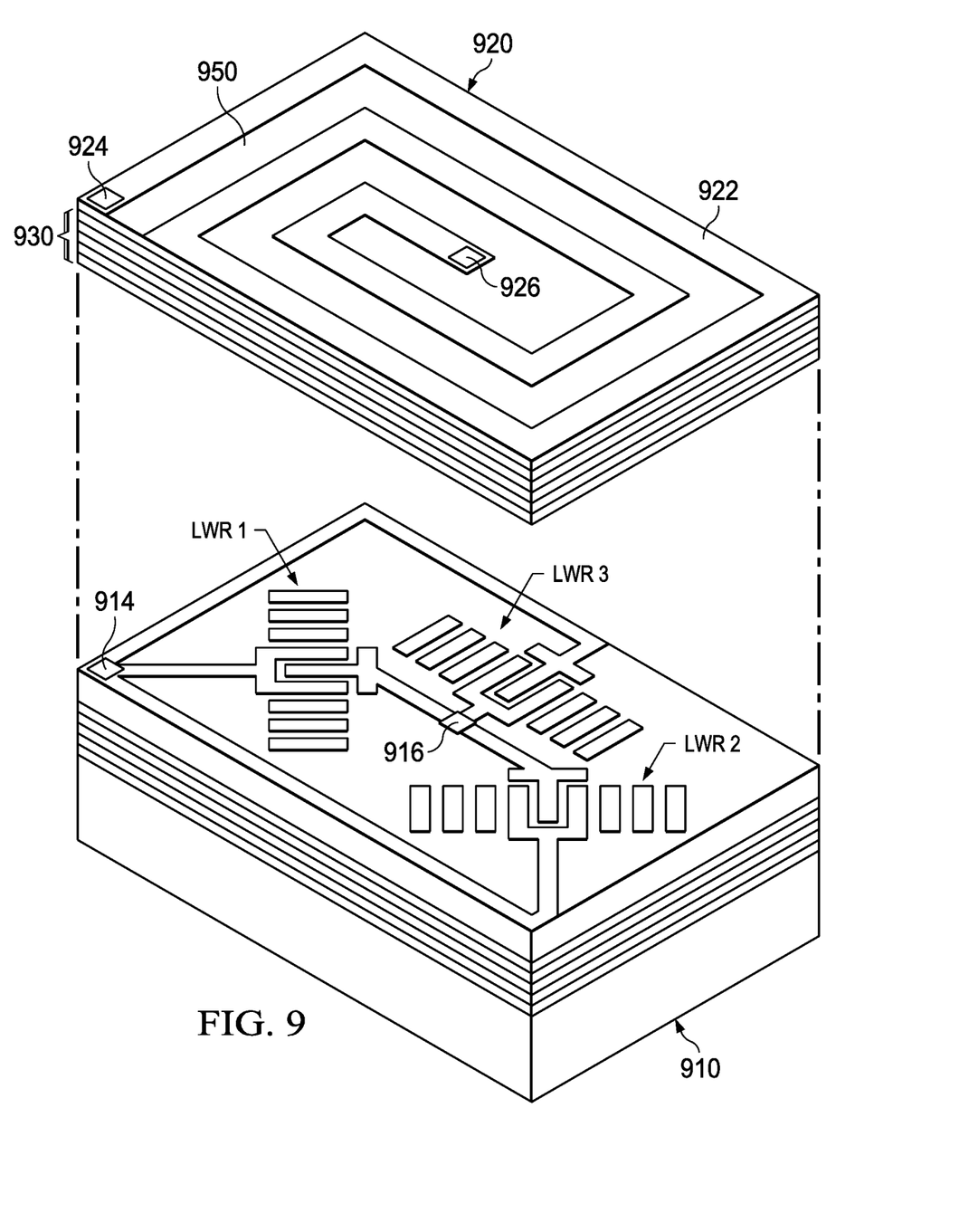
FIG. 9 shows a 3D view of the torque sensor interrogated by a wireless off-chip transponder.

FIG. 9 shows an example of an antenna assembly 920 provided on an LWR torque sensor 910. The antenna assembly 920 permits an external transmitter/receiver to receive wireless signals from the torque sensor to wirelessly assess torque or compressive/expansion forces experienced by the LWR torque sensor. LWR torque sensor 910 can be constructed in any manner such as in the examples described above. The torque sensor 910 includes multiple Lamb wave resonators. The antenna assembly 920 includes a conductive antenna 922, formed into a suitable shape. In the example of FIG. 9, the conductive antenna 922 is spiral-shaped, but the antenna can have other shapes in other examples. The antenna assembly 920 also includes Bragg reflector 930 comprising alternating lower and higher impedance layers as described above. The antenna assembly 920 in this example further includes a passivation layer 950. Connection points 924 and 926 on opposite ends of the conductive antenna 922 connect through vias to corresponding connection points 914, 916 on the LWR torque sensor 910.

Figure 10:
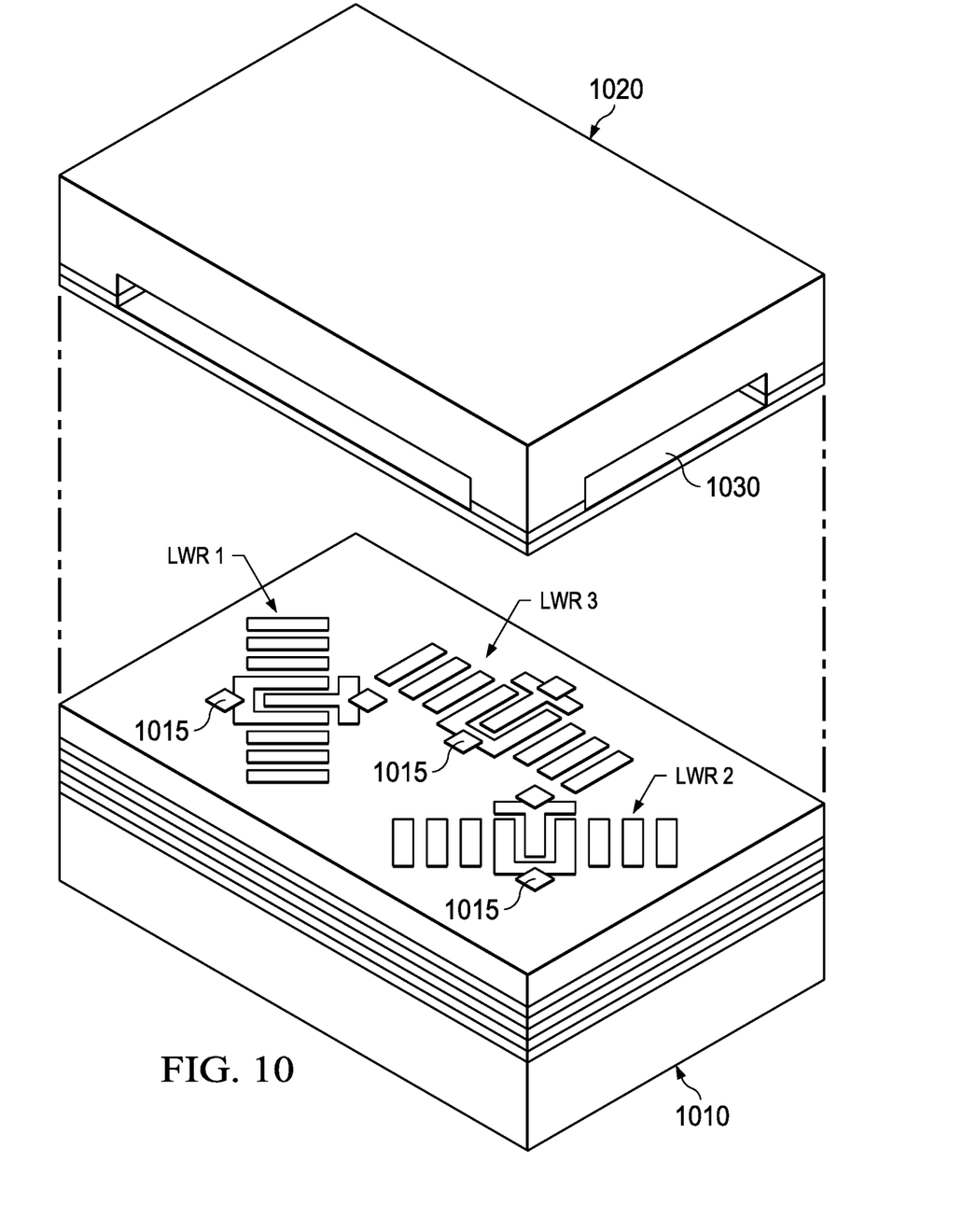
FIG. 10 shows a view of the torque sensor interrogated by an on-chip circuit.

FIG. 10 shows an example of LWR torque sensor 1010 coupled to a separate chip 1020. The chip 1020 includes an integrated circuit/die 1030 that has direct electrical connection to connection points 1015 on the LWRs of the LWR torque sensor 1010. Protective cap 1020 protects the integrated circuit 1030.

Figure 11:
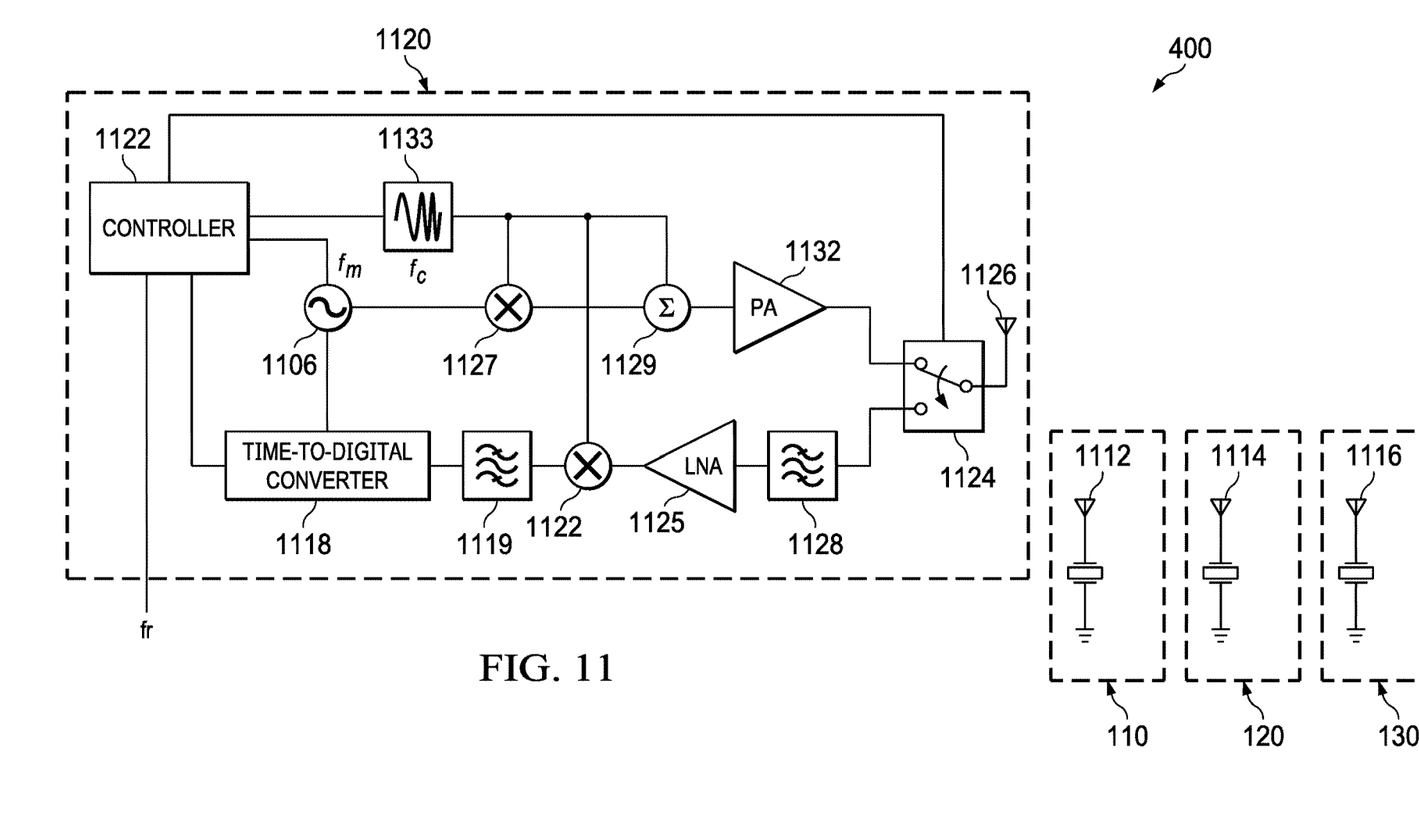
FIG. 11 illustrates a monitoring system based on frequency shift detection used for processing the signals from the LWR torque sensors in an on-chip monitoring configuration.

FIG. 11 shows an example circuit 400 for operating the LWR torque sensor to make an assessment of torque using a wireless transmission to/from the LWR torque sensor. This example includes a sensor interrogator 1120 in wireless communication with the LWRs 110, 120, and 130 of the LWR torque sensor. Each LWR has an antenna 112, 114, and 116, as shown. The example sensor interrogator 1120 includes a controller 1122, a voltage-controlled oscillator (VCO) 1133, an oscillator 1106, a mixer 1127, an adder 1129, an amplifier 1132, a switch 1124, an antenna 1126, a radio frequency filter 1128, an amplifier 1125, a mixer 1122, an intermediate frequency filter 1119, and a time-to-digital converter (TDC) 318. The controller 1122 is, for example, a microcontroller. In other examples, the controller 1122 is a state machine.

In the example of FIG. 4, the controller 1122 is coupled to the switch 1124. The controller 1122 determines whether to transmit or receive signals. For example, after generating a signal at the VCO 1133 and transmitting the signal via antenna 1126, the controller 1122 toggles the switch 1124 to connect the antenna 1126 to the radio frequency filter 1128. The amplifier 1132 is coupled to the adder 1129 and to the switch 1126. In one example, the amplifier 1132 is a power amplifier. For example, the amplifier 1132 is an electronic amplifier that amplifies the low-power radio frequency signal from the adder 1129 to be transmitted to one or more of the LWRs 110, 120, and 130 as a high power signal to be sent from the antenna 1126.

In the example of FIG. 4, the switch 1124 is coupled to the amplifier 1132, the antenna 1126, the radio frequency filter 1128, and the controller 1122. The switch 1124 is a device that is configured to be controlled to connect the amplifier 1126 to the antenna 1126 or to connect the antenna 1126 to the radio frequency filter 1128. In the example of FIG. 4, the switch 1124 is a two-to-one multiplexor. The antenna 1126 is coupled to the switch 1124 and wirelessly coupled to the antennas 1112, 1114, and 1116 of the LWRs 110, 120, and 130. The first antenna 406 is, for example, a spiral antenna. In other examples, the antenna 1126 is a fractal antenna, a tunable slot antenna, or other suitable antenna.

In the example illustrated in FIG. 4, the radio frequency filter 1128 is coupled to the switch 1124 and the amplifier 1125. In one example, the radio frequency filter 1128 is a bandpass filter. For example, the radio frequency filter 1128 may be an LC tank. In other examples, the radio frequency filter 1128 is an acoustic filter. The radio frequency filter 1128 filters unwanted frequencies from the response to the query signal from one or more of the LWRs 110, 120, and 130. The amplifier 1125 is coupled to the radio frequency filter 1128 and to the mixer 1119. In one example, the amplifier 1125 is a low noise amplifier. For example, the amplifier 1125 is an electronic amplifier that amplifies a low-power signal from the radio frequency filter 1128 without significantly degrading the signal-to-noise ratio (SNR) of the signal from the radio frequency filter 1128. The output of the amplifier 1125 is to be transmitted to the mixer 1122.

In the example of FIG. 4, each of the antenna 1112, 1114, and 1116 receive query signals from the sensor interrogator 1120 sent via the antenna 1126. Each of the LWRs 110, 120, and 130 wirelessly transmit responses to the query signal to the antenna 1126 via their respective antennas. The controller 1122 tunes the oscillation frequency of the VCO 1133 based on the group delay measured by the TDC 1118. The frequency generated by the VCO 1133 has a carrier frequency (fc). The controller 1122 can generate the The oscillator 1106 is configured to generate a signal (e.g., a modulating signal) to modulate the signal generated by the VCO 1133. The frequency of operation of the oscillator 1106 is selected based on design specifications. The frequency of operation of the modulation oscillator 306 is referred to as the modulation frequency ($f_m$). In one example, the modulation frequency is 250 kilohertz (kHz). The modulation frequency is selected so that the period of the signal generated by the modulation oscillator 1106 is greater than the time constant associated with LWRs 110, 120, 130. Additionally, the amplitude of the signal generated by the oscillator 1106 is adjustable based on a signal received from the controller 1122.

The mixer 1127 multiplies the signal generated by the VCO 1133 and the signal generated by the oscillator 1106. The mixer 308, as a result of mixing the signal generated by the VCO 1133 and the oscillator 1106, generates a modulated signal that oscillates at the frequency of the VCO 1133 and has an amplitude that tracks the amplitude of the signal generated by the oscillator 1106. The adder 1129 adds the signal generated by the VCO 1133 and the signal generated by the mixer 1127. The resultant signal generated by the adder 1129 has an increased amplitude, and a phase shift of 45° as compared to the signal generated by the VCO 1133.

The mixer 1122 multiplies the signal generated by the VCO 1133 by the signal generated by the amplifier 1127. As a result, the mixer 1122 generates a demodulated signal that oscillates at double the carrier frequency used by the controller 1122 to query the LWRs 110, 120, and 130. In addition, the signal will include a sinusoidal component that oscillates at the modulation frequency ($f_m$) and can be used to determine the group delay associated with one of the LWRs, depending on which of the LWRs the controller 1122 queries.

The TDC 1118 is a circuit that generates a digital representation of the time delay that exists between two input signals oscillating at the same frequency. The TDC 1118 compares the signal received from the intermediate frequency filter 1119 with the signal generated by the oscillator 1106. The TDC 1118 determines the time delay between the signal received from the intermediate frequency filter 1119 and the oscillator 1106 as well as the polarity of the time delay. The signal generated by the TDC 1118 includes information describing the time delay between the signal generated by the oscillator 1106 and the signal received from the intermediate frequency filter 1119 (e.g., the group delay) as well as information describing the polarity of the group delay associated with one or more of the LWRs 110, 120, and 130. In the example of FIG. 11, the resolution is set by the resolution of the TDC 1118. The TDC 1118 relies on the high frequency of operation (e.g., an internal oscillator that operates at a high frequency) to capture small time delays and achieve a high resolution.

The controller 1122 queries, or is configured to query, one or more of the LWRs 110, 120, and 130 with a query signal. The query signal generated in response to the controller 1122 is amplitude modulated by mixer 1127 and adder 1129 before being wirelessly transmitted to one of the LWRs 110, 120, and 130. After receiving the response to the query signal from LWR, the response to the query signal is demodulated by mixer 1122. The group delay of LWRs 110, 120, and 130 is detected by the TDC 1118. After determining the group delay and associated polarity of the LWR based on the signal output from the TDC 1118, the controller 1122 determines whether the frequency of operation of the VCO 1133 is to be adjusted or not to be adjusted to determine the resonance frequency of one or more of the LWRs 110, 120, 130.

If the frequency of operation of the VCO 1133 is to be adjusted, the controller 1122 queries the LWR to determine its resonance frequency. After determining the resonance frequency (fr) of one or more of the LWRs 110, 120, and 130, the controller 1122 determines a torque value and/or a value indicative of compression/expansion and transmits the resulting values to the computing. In some examples, the controller 1122 transmits the resonant frequencies to an external computing system to compute the torque values. Such an external system can then adjust the environment that the LWR torque sensor is located in or near (e.g. on a rotating shaft of a motor) to ensure the compliance with safe/desired torque or compression/expansion forces.

The controller 1122, VCO 1133, oscillator 1106, mixers 1127 and 1122, adder 1129, amplifiers 1132 and 1125, switch 1124, antenna 1126, radio frequency filter 1128, intermediate frequency filter 1119, and the TDC 318, are implemented on a first die, and the LWRs 110, 120, and 130 are implemented on a second die together with their respective antennas 1112, 1114, and 1116.

Figure 12:
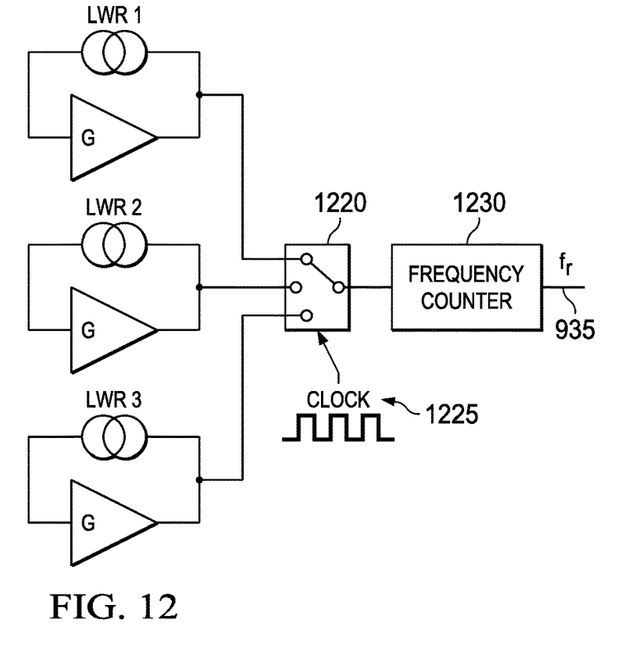
FIG. 12 illustrates monitoring system based on group delay detection for processing the signals from the LWR torque sensors in an off-chip monitoring configuration.

FIG. 12 shows another example for operating the LWR torque sensors to make an assessment of torque. This example is for an LWR torque sensor that includes an integrated circuit electrically connected to the LWRs (e.g., as shown in FIG. 10). LWR1, LWR2, and LWR3 (e.g., LWRs 110, 120, 130) are coupled to a frequency counter 1230 through a multiplexer 1220. A clock 1225 control the state of the multiplexer 1220 to connect each LWR to the frequency counter in a period fashion. The frequency counter determines the frequency (fr 935) of the signal from each LWR and uses the frequency determinations to determine torque as explained above.

Figure 13:
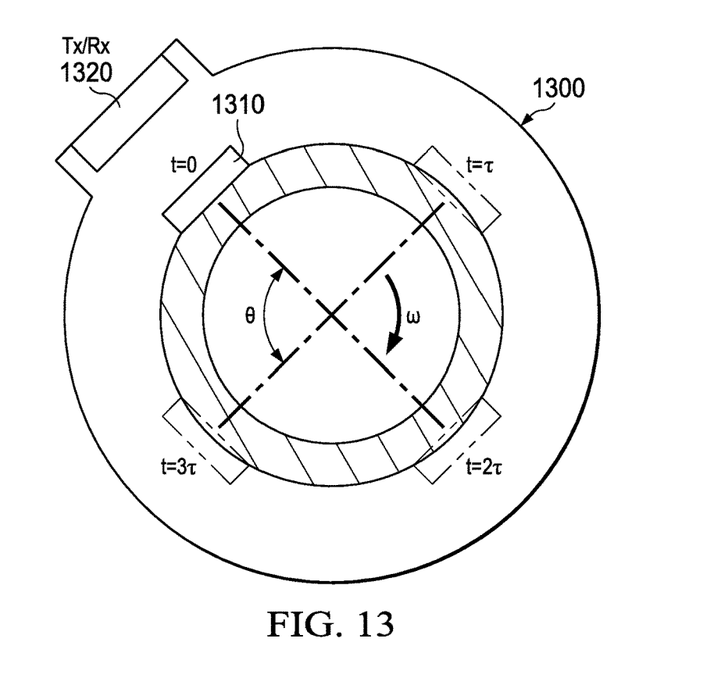
FIG. 13 illustrates a cross section of a rotation shaft in which an LWR-based torque sensor device is attached to the shaft and monitored by a separate transmit/receive circuit.

FIG. 13 shows a cross-section of a rotating shaft 1300 with an LWR torque sensor 1310 mounted thereto, and in wireless communication with an external transmitter/receiver (TX/RX) 1320. The TX/RX 1320 interrogates the LWR torque sensor at a rate, T, per the following equations:

$$\tau = \frac{\theta}{\omega_{max}} \quad (14)$$

where θ is the angular range that the LWR torque sensor 1310 can wirelessly communicate with the TX/RX 1320, and ωmax is maximum expected angular speed of the rotating shaft 1300.

The LWR-based torque sensors described herein are fabricated in IC form. Further, compared to SAW torque sensors, LWR-based torque sensors are generally smaller due to using fewer lower impedance elements for the side acoustic reflectors for a target reflection coefficient. Some of the examples described herein show LWR torque sensor ICs that are encapsulated thereby protecting the LWRs from external contaminants.

Modifications are possible in the described embodiments, and other embodiments are possible, within the scope of the claims.

What is claimed is:

1. A torque sensor chip, comprising:
   a semiconductor substrate;
   an acoustic reflector formed on the semiconductor substrate;
   a first Lamb wave resonator (LWR) formed on a surface of the acoustic reflector opposite the semiconductor substrate, the first LWR oriented at a first angle with respect to an axis of the torque sensor chip;
   a second LWR formed on the surface of the acoustic reflector opposite the semiconductor substrate, the second LWR oriented at a second angle, different than the first angle, with respect to the axis of the torque sensor chip; and
   a third LWR formed on the surface of the acoustic reflector opposite the semiconductor substrate, the third LWR oriented approximately parallel to the axis of the torque sensor chip.

2. The torque sensor chip of claim 1, wherein the first angle is +45 degrees, and the second angle is −45 degrees.

3. The torque sensor chip of claim 1, wherein the acoustic reflector comprises a Bragg reflector.

4. The torque sensor chip of claim 3, wherein the Bragg reflector comprises alternating layers of lower acoustic impedance and higher acoustic impedance, the layers of lower acoustic impedance being of a lower acoustic impedance than the layers of higher acoustic impedance.

5. The torque sensor chip of claim 1, further comprising a first side acoustic reflector formed on the first LWR resonator, and a second side acoustic reflector formed on the second LWR resonator.

6. The torque sensor chip of claim 1, wherein the first side reflector comprises a first reflector element spaced apart from a second reflector element, and the second side reflector comprises a third reflector element spaced apart from a fourth reflector element.

7. The torque sensor chip of claim 1, wherein the first LWR includes a first set of electrodes and the second LWR includes a second set of electrodes, and the torque sensor chip further comprises a first pair of acoustic side reflectors formed on opposite sides of the first set of electrodes, and a second pair of acoustic side reflectors formed on opposite sides of the second set of electrodes.

8. The torque sensor chip of claim 1, wherein the first LWR resonator includes a first interdigitated set of electrodes and the second LWR resonator includes a second interdigitated set of electrodes.

9. The torque sensor chip of claim 1, wherein the acoustic reflector is a first acoustic Bragg reflector, and the torque sensor chip further comprises a second Bragg reflector formed on a side of the first and second LWRs opposite the first Bragg reflector.

10. The torque sensor chip of claim 1, wherein the acoustic reflector is a first acoustic reflector comprising a first cavity, and the IC further comprises a second acoustic formed on a side of the first and second LWRs opposite the first acoustic reflector, the second acoustic reflector comprising a second cavity.

11. The torque sensor chip of claim 1, wherein the first LWR, and the second LWR, and the third LWR are encapsulated.

12. The torque sensor chip of claim 1, wherein the third LWR is oriented at an angle of 0 degrees with respect to the axis of the torque sensor chip.

13. The torque sensor chip of claim 1, wherein the acoustic reflector comprises a cavity.

14. The torque sensor chip of claim 1, further comprising a trench formed around at least a portion of the third LWR.

15. A device, comprising:
   a semiconductor substrate having a cavity formed therein; and
   a Lamb wave resonator (LWR) including a metal layer formed over the cavity to completely cover the cavity.

16. The device of claim 15, wherein the metal layer has a first surface facing toward the cavity and a second surface facing away from the cavity, the device further comprising a piezoelectric layer formed on the second surface.

17. The device of claim 15, wherein the LWR includes an electrode, and the semiconductor device further comprise a first pair of acoustic side reflectors formed on opposite sides of the electrode.

18. The device of claim 17, wherein the electrode comprises an interdigitated electrode.

19. The device of claim 15, wherein the LWR is encapsulated.

20. The device of claim 15, wherein the cavity is a first cavity, and the device further comprises a second a second cavity, the LWR disposed between the first and second cavities.

21. A torque sensor device, comprising:
   a shaft;
   a semiconductor substrate formed on an outer surface of the shaft;
   a Bragg acoustic reflector formed on the semiconductor substrate;
   a first Lamb wave resonator (LWR) formed on a surface of the Bragg acoustic reflector opposite the semiconductor substrate, the first LWR oriented at a first angle with respect to an axis of the shaft, the first LWR resonator including a first interdigitated electrode and a first pair of side acoustic reflectors on opposite sides of the first interdigitated electrode;
   a second LWR formed on the surface of the Bragg acoustic reflector opposite the semiconductor substrate, the second LWR oriented at a second angle, different than the first angle, with respect to the axis of the shaft, the second LWR resonator including a second interdigitated electrode and a second pair of side acoustic reflectors on opposite sides of the second interdigitated electrode;
   a third LWR formed on the surface of the Bragg reflector opposite the semiconductor substrate, the third LWR oriented approximately parallel to the axis of the shaft and a circuit configured to determine torque based on signals from the first, second, and third LWRs.

22. The torque sensor device of claim 21, wherein the Bragg acoustic reflector comprises multiple layers of alternating lower and higher acoustic impedance.

23. The torque sensor device of claim 21, wherein the first, second and third LWRs are encapsulated.

* * * * *